United States Patent
Lee (10) Patent No.: US 10,624,210 B2
(45) Date of Patent: Apr. 14, 2020

(54) PRINTED CIRCUIT BOARD AND DISPLAY DEVICE INCLUDING THE SAME

(71) Applicant: LG Display Co., Ltd., Seoul (KR)

(72) Inventor: Jaeseung Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 15/348,044

(22) Filed: Nov. 10, 2016

(65) Prior Publication Data
US 2017/0171976 A1   Jun. 15, 2017

(30) Foreign Application Priority Data
Dec. 15, 2015 (KR) .................. 10-2015-0179419

(51) Int. Cl.
| H05K 1/11 | (2006.01) |
| H05K 1/14 | (2006.01) |
| H05K 1/02 | (2006.01) |
| H05K 1/18 | (2006.01) |

(52) U.S. Cl.
CPC .............. *H05K 1/14* (2013.01); *H05K 1/0215* (2013.01); *H05K 1/0298* (2013.01); *H05K 1/181* (2013.01); *H05K 2201/04* (2013.01); *H05K 2201/1031* (2013.01); *H05K 2201/10128* (2013.01); *H05K 2201/10136* (2013.01); *H05K 2201/10257* (2013.01); *H05K 2201/10409* (2013.01); *H05K 2201/20* (2013.01); *H05K 2201/2036* (2013.01); *Y02P 70/611* (2015.11)

(58) Field of Classification Search
CPC ...... H05K 1/0215; H05K 1/0298; H05K 1/14; H05K 1/181; H05K 2201/04; H05K 2201/10128; H05K 2201/10136; H05K 2201/10257; H05K 2201/1031; H05K 2201/10409; H05K 2201/20; H05K 2201/2036; Y02P 70/611

See application file for complete search history.

(56) References Cited

U.S. PATENT DOCUMENTS

| 2007/0290589 A1* | 12/2007 | Shin ................... H05K 5/02 313/46 |
| 2008/0123016 A1* | 5/2008 | Kwak ............... G02F 1/133308 349/59 |
| 2009/0185102 A1* | 7/2009 | Lee ..................... G02F 1/13452 349/58 |
| 2013/0162278 A1* | 6/2013 | Chung ................ B23K 1/0008 324/755.01 |
| 2014/0057731 A1* | 2/2014 | Stephens ............... H05K 3/341 470/25 |

(Continued)

OTHER PUBLICATIONS

Communication dated May 15, 2017 from the European Patent Office in counterpart EP application No. 16202383.2.

(Continued)

*Primary Examiner* — Yuriy Semenenko
(74) *Attorney, Agent, or Firm* — Morgan, Lewis & Bockius LLP (57) ABSTRACT

A printed circuit board and a display device are provided. The printed circuit board includes a plurality of insulation layers; at least one metal layer between the plurality of insulation layers; and a fixing member fixed to a surface of one of the at least one metal layer and passing through an outermost one of insulation layers to protrude to the outside.

13 Claims, 7 Drawing Sheets

(56) References Cited

U.S. PATENT DOCUMENTS

2015/0008028 A1* 1/2015 Tada ................ H05K 3/301
    174/266
2017/0079129 A1* 3/2017 Chin ................ H05K 1/0204
2017/0330818 A1* 11/2017 Yamagishi ........... H01L 23/29
2018/0160547 A1* 6/2018 Ozaki ............... H05K 3/4046

OTHER PUBLICATIONS

The First Office Action dated Oct. 12, 2018, from the State Intellectual Property Office of People's Republic of Chinese in counterpart Chinese application No. 201611122998.8.

* cited by examiner

PRINTED CIRCUIT BOARD AND DISPLAY DEVICE INCLUDING THE SAME

This application claims the priority of Korean Patent Application No. 2015-0179419 filed on Dec. 15, 2015, in the Korean Intellectual Property Office, which is hereby incorporated herein by reference.

BACKGROUND

Field

The present disclosure relates to a printed circuit board and a display device including the same, and more particularly, to a printed circuit board in which the efficiency in distributing and disposing lines can be increased and a display device including the same.

Description of the Related Art

In general, a "printed circuit board" refers to a substrate manufactured by forming a metal layer on a thin insulator substrate and removing a part of the metal layer to configure an electronic circuit. The printed circuit board has been used in various fields. For example, a printed circuit board connected to a display panel in a display device is used to supply signals for driving the display panel or signals for controlling an operation of the display panel.

Figure 1:
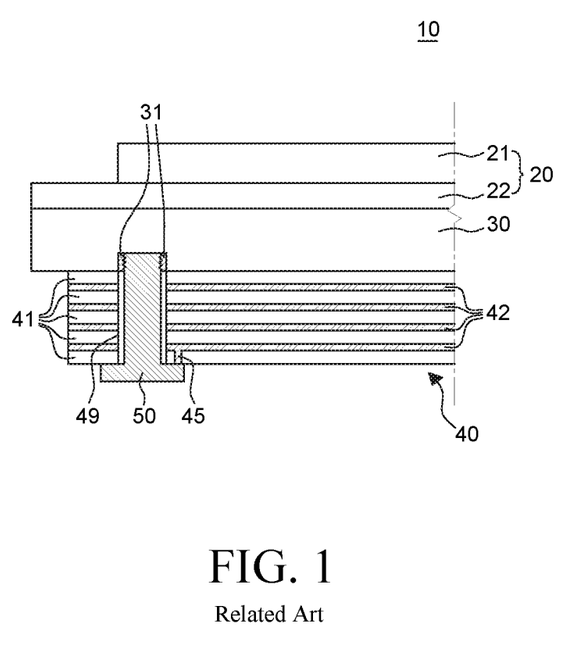
FIG. 1 is a cross-sectional view illustrating a related art display device.
Figure 2:
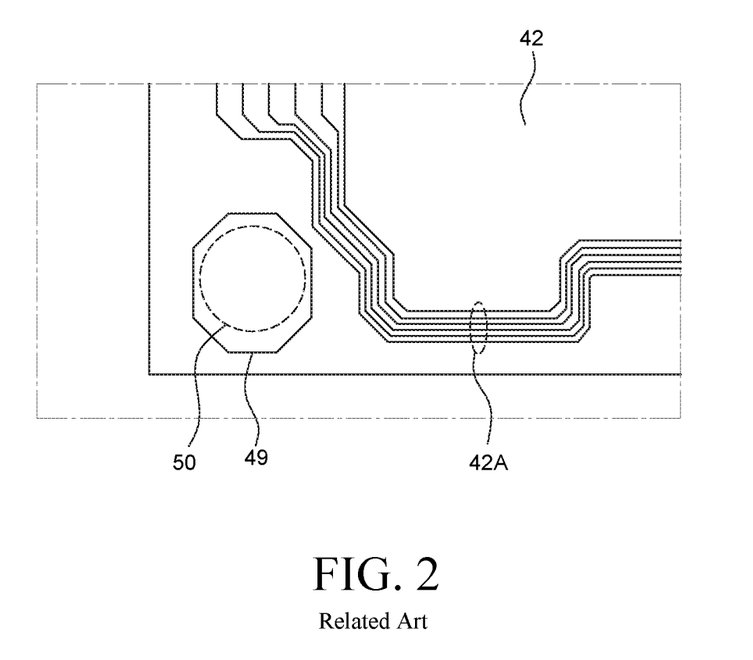
FIG. 2 is a plane view illustrating one of the metal layers of a printed circuit board in accordance with FIG. 1.

FIG. 1 is a cross-sectional view illustrating a related art display device. FIG. 2 is a plane view illustrating one of the metal layers of a printed circuit board in accordance with FIG. 1. In FIGS. 1 and 2, a related art display device 10 comprises a display panel 20 including a color filter substrate 21 and a TFT substrate 22, a back light unit 30, and a printed circuit board 40 under the back light unit 30.

The TFT substrate 22 includes a thin film transistor (TFT) configured to control a plurality of pixels including pixel electrodes and ON/OFF of a driving voltage transferred to each of the plurality of pixels. In the color filter substrate 21, a color filter for realizing a color, a common electrode, and a liquid crystal layer are disposed. However, the present disclosure is not limited thereto. The common electrode may be disposed in the TFT substrate 22 rather than in the color filter substrate 21. Although not illustrated in FIG. 1, a liquid crystal layer is interposed between the color filter substrate 21 and the TFT substrate 22. Further, a polarizing plate may be further provided on the color filter substrate 21 and under the TFT substrate 22. Because the display panel 20 is not self-luminous, the back light unit 30 configured to supply light to the display panel 20 is provided under the display panel 20.

As shown in FIG. 1, the printed circuit board 40 includes a plurality of insulation layers 41 and a plurality of metal layers 42 each disposed between the insulation layers 41. In the printed circuit board 40, a through-hole 49 penetrating the plurality of insulation layers 41 and the plurality of metal layers 42 is formed. A fixing bolt 50 may be inserted into the through-hole 49. The fixing bolt 50 includes a head part having a wide cross-sectional area and a longitudinal part extended from the head part in a longitudinal direction. Further, a fixing nut 31, which can be combined with the fixing bolt 50, is inserted into the back light unit 30. The fixing bolt 50 passes through the through-hole 49 of the printed circuit board 40 and then is engaged with the fixing nut 31 of the back light unit 30. The printed circuit board 40 is fixed to the back light unit 30 as described above.

As shown in FIG. 2, the through-hole 49 through which the fixing bolt 50 is inserted is formed in the metal layers 42 of the printed circuit board 40. The through-hole 49 is formed with a larger diameter than that of the fixing bolt 50 to allow for any error in insertion position of the fixing bolt 50. Thus, the longitudinal part of the fixing bolt 50 is disposed to be spaced away from the plurality of insulation layers 41 and the plurality of metal layers 42 within the printed circuit board 40. That is, a space is present between the longitudinal part of the fixing bolt 50 and the through-hole 49. Further, the longitudinal part of the fixing bolt 50 is not in direct contact with the inside of the printed circuit board 40.

The fixing bolt 50 may connect the printed circuit board 40 to the ground through the head part. Specifically, the head part of the fixing bolt 50 is brought into contact with a via 45 of the printed circuit board 40 so that the fixing bolt 50 is electrically connected to the printed circuit board 40. Further, the fixing bolt 50 is engaged with the fixing nut 31 inserted into the back light unit 30 and, thus, electrically connected to the back light unit 30. Therefore, the printed circuit board 40 is electrically connected to the back light unit 30 and then grounded through the via 45, the head part of the fixing bolt 50, and the fixing nut 31.

A ground area between the fixing bolt 50 and the printed circuit board 40 corresponds to a contact area between the via 45 and the head part of the fixing bolt 50. Thus, the ground area may be very small. Further, because the through-hole 49 is formed in the metal layers 42, lines 42A may not be disposed around the through-hole 49, which causes loss and limitation on space. Further, the lines 42A formed by patterning the metal layer 42 cannot overlap the through-hole 49 formed in the metal layers 42 and thus need to be turned or bent several times to avoid the through-hole 49. In this case, signal characteristics of signals transferred through the lines 42A may be adversely affected. Particularly, signals transferred through the lines 42A may be transmitted in pairs to minimize effects caused by external noise. For example, the signals transmitted in pairs respectively have voltages with different polarities. A voltage difference between the lines 42A transmitted in pairs is transferred as a single signal. Thus, the lines 42A transmitted in pairs need to have the same length. However, because the lines are disposed to avoid the through-hole 49, there will be a difference in length between a pair of lines, thereby deteriorating signal characteristics.

Accordingly, based upon such problem recognition by present the inventor and to solve such problem, a printed circuit board in which the straightness of lines and the layout efficiency of the lines can be increased and a display device including the same are needed.

SUMMARY

Accordingly, the present disclosure is directed to a printed circuit board and a display device including the same that substantially obviate one or more of the problems due to limitations and disadvantages of the related art.

An object of the present disclosure is to provide a printed circuit board capable of increasing the straightness of lines and the layout efficiency of the lines in the printed circuit board and a display device including the same.

Additional features and advantages of the disclosure will be set forth in the description that follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a printed circuit board comprises a plurality of insulation layers; at least one metal layer between the plurality of insulation layers; and a fixing member fixed to the at least one metal layer and passing through an outermost one of the insulation layers to protrude externally.

In another aspect, a display device comprises a display panel; a first device unit under the display panel; a second device unit under the first device unit; a printed circuit board between the first device unit and the second device unit and including a plurality of insulation layers, at least one metal layer between the plurality of insulation layers, and a first fixing member fixed to a closest one of the at least one metal layer to the second device unit and passing through an outermost one of the insulation layers to protrude externally and a second fixing member passing through the second device unit and fixed to the first fixing member.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the example embodiments of the present disclosure are merely examples, and the present disclosure is not limited thereto. Further, in the following description, a detailed explanation of well-known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Because the size and thickness of each component illustrated in the drawings are represented for convenience in explanation, the present disclosure is not necessarily limited to the illustrated size and thickness of each component.

The features of various example embodiments of the present disclosure can be partially or entirely bonded to or combined with each other and can be interlocked and operated in technically various ways as can be fully understood by a person having ordinary skill in the art, and the various example embodiments can be carried out independently of or in association with each other.

Reference will now be made in detail to embodiments of the present disclosure, examples of which are illustrated in the accompanying drawings.

Figure 3:
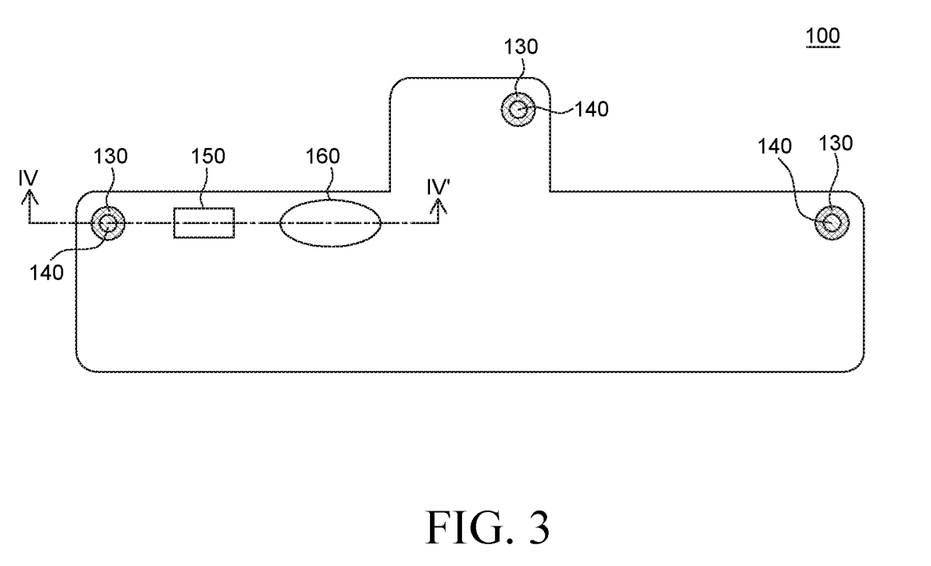
FIG. 3 is a rear view illustrating a printed circuit board according to an example embodiment of the present disclosure.
Figure 4:
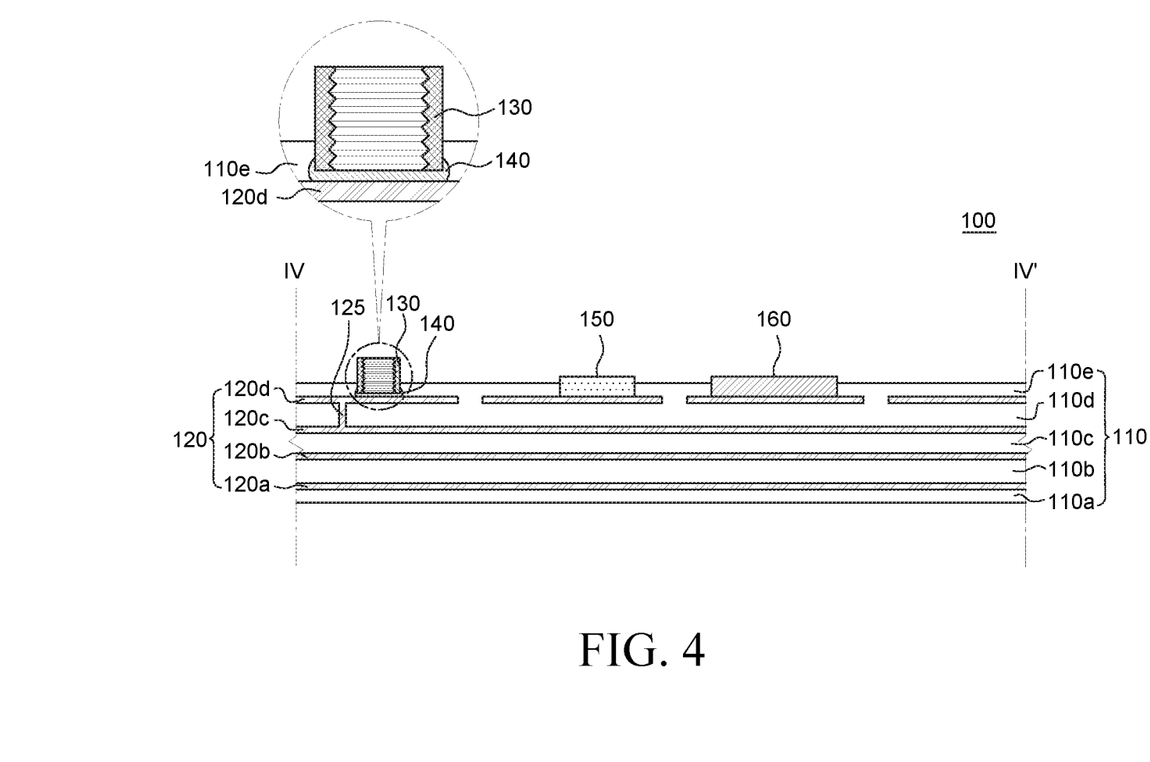
FIG. 4 is a cross-sectional view illustrating the printed circuit board taken along line IV-IV' of FIG. 3.

FIG. 3 is a rear view illustrating a printed circuit board according to an example embodiment of the present disclosure. FIG. 4 is a cross-sectional view illustrating the printed circuit board taken along line IV-IV' of FIG. 3. As shown in FIGS. 3 and 4, a printed circuit board 100 may include a plurality of insulation layers 110, a plurality of metal layers 120, a fixing member 130, a driving unit 150, and a communication unit 160.

The printed circuit board 100 includes the plurality of insulation layers 110 and the plurality of metal layers 120 disposed between the plurality of insulation layers 110. That is, the plurality of insulation layers 110 and the plurality of metal layers 120 are laminated alternately. For example, as illustrated in FIG. 4, a first insulation layer 110a is a lowermost surface of the printed circuit board 100, and a first metal layer 120a is provided thereon. Further, a second insulation layer 110b is on a top surface of the first metal layer 120a, and a second metal layer 120b is on a top surface of the second insulation layer 110b. Furthermore, a third insulation layer 110c is on a top surface of the second metal layer 120b, and a third metal layer 120c is on a top surface of the third insulation layer 110c. A fourth insulation layer 110d is on a top surface of the third metal layer 120c, and a fourth metal layer 120d is on a top surface of the fourth insulation layer 110d. Also, a fifth insulation layer 110e is on a top surface of the fourth metal layer 120d. That is, the plurality of metal layers 120 of the printed circuit board 100 is between the plurality of insulation layers 110. A lamination structure of the printed circuit board 100 in FIG. 4 is illustrated as an example. In some example embodiments, the number of metal layers and the number of insulation layers may be changed. However, herein, a plurality of insulation layers and at least one metal layer are included in the printed circuit board 100.

The insulation layers 110 define outermost surfaces of the printed circuit board 100. For example, the first insulation layer 110a forms the lowermost surface of the printed circuit board 100, and the fifth insulation layer 110e forms an uppermost surface of the printed circuit board 100. Thus, the first insulation layer 110a and the fifth insulation layer 110e, which define the outermost surfaces of the printed circuit board 100, can insulate the plurality of metal layers 120 within the insulation layers from a conductive material outside the printed circuit board 100.

The plurality of insulation layers 110 is formed of an insulation material to insulate each of the plurality of metal layers 120. In some example embodiments, the plurality of insulation layers 110 may be formed of different materials, respectively. For example, the fifth insulation layer 110e and the first insulation layer 110a, which define the outermost surfaces of the printed circuit board 100, may be formed of solder resist. Further, the second insulation layer 110b, the third insulation layer 110c, and the fourth insulation layer 110d may be formed as glass fiber layers.

Some of the plurality of metal layers 120 are insulated from the adjacent metal layers 120 by the plurality of insulation layers 110. Therefore, the plurality of metal layers 120 may transfer different signals and different voltages, respectively. Further, some of the plurality of metal layers 120 may be connected to each other. Therefore, the plurality of metal layers 120 may transfer the same signal and the same voltage. Further, each of the plurality of metal layers 120 may be insulated in a partial area and may be electrically connected to the adjacent metal layers. A configuration in which the plurality of metal layers 120 is insulated in a partial area and electrically connected to other metal layers in a partial area may vary depending on a circuit design within the printed circuit board 100.

The plurality of metal layers 120 may be formed of conductive materials and may be formed of the same material. For example, all the first metal layer 120a, the second metal layer 120b, the third metal layer 120c, and the fourth metal layer 120d may be formed of copper. Herein, each of the plurality of metal layers 120 may be patterned to form lines. That is, each of the plurality of metal layers 120 may be referred to as lines.

The driving unit 150 and the communication unit 160 are on a top surface of the printed circuit board 100. For example, the driving unit 150 and the communication unit 160 are on the fourth metal layer 120d in the printed circuit board 100. FIGS. 3 and 4 illustrate only one driving unit 150 and only one communication unit 160. However, in some example embodiments, the printed circuit board 100 may include a plurality of driving units 150 and/or a plurality of communication units 160. Otherwise, the communication unit 160 may be omitted depending on the kind of a device to which the printed circuit board 100 is applied.

The fixing member 130 is fixed to one of the plurality of metal layers 120. For example, the fixing member 130 may be fixed to the fourth metal layer 120d which is the outermost metal layer from among the plurality of metal layers 120. Further, the fixing member 130 penetrates the fifth insulation layer 110e, which is the outermost insulation layer among the plurality of insulation layers 110, and protrudes to the outside. For example, the fixing member 130 may be in contact with the fourth metal layer 120d and may penetrate the fifth insulation layer 110e, thereby protruding to the outside.

In FIG. 4, the printed circuit board 100 includes a conductive material 140 configured to fix the fixing member 130 to the fourth metal layer 120d as the outermost metal layer in a manner to electrically connect the fixing member 130 with the outermost metal layer 120d. For example, the conductive material 140 may be in direct contact with the fixing member 130 and the fourth metal layer 120d such that the fourth metal layer 120d of the printed circuit board 100 can be grounded by the fixing member 130.

For example, the conductive material 140 may be disposed on the top surface of the fourth metal layer 120d and in contact with a bottom surface or an external surface of the fixing member 130. Herein, the conductive material 140 may be metal containing lead. When the fixing member 130 is on the fourth metal layer 120d, the fixing member 130 may be fixed to the fourth metal layer 120d in a surface mount manner. That is, the fixing member 130 and the fourth metal layer 120d may be fixed and electrically connected to each other by performing a soldering process using the conductive material 140.

In some example embodiments, the fixing member 130 may be fixed to a plurality of metal layers 120. For example, the fixing member 130 may be fixed to the fourth metal layer 120d and the third metal layer 120c with the conductive material 140. In this case, the fixing member 130 penetrates only the fifth insulation layer 110e from among the first insulation layer 110a and the fifth insulation layer 110e disposed at an outermost periphery and protrude to the outside. Even if the fixing member 130 is fixed to all the plurality of metal layers, the fixing member 130 may be provided to penetrate only one of the first insulation layer 110a and the fifth insulation layer 110e at an outermost periphery and protrude to the outside.

The fixing member 130 is formed of a conductive material to be electrically grounded, thereby connecting the fourth metal layer 120d to ground. For example, the fixing member 130 may be formed of a conductive material to be electrically connected to a conductive device, such as a cover shield. Here, the fixing member 130 may be formed of a metal, such as copper or iron. Details of the configuration for electrical connection to an external ground through the fixing member 130 will be described later with reference to FIGS. 5 to 7.

The fixing member 130 may be a nut formed of a metal material. The fixing member 130 may be connected to a bolt to fix or mount the printed circuit board 100 within a device. Further, the metal layers 120 may be grounded through the metal layers 120, the fixing member 130, and the bolt. However, the present disclosure is not limited thereto. The fixing member 130 may have any structure that can be engaged with another separate fixing member.

At least one of the plurality of metal layers 120 is spaced away from the fixing member 130. For example, as illustrated in FIG. 4, if the fixing member 130 is fixed to the fourth metal layer 120d, the fixing member 130 may be spaced away from the other metal layers 120a, 120b, and 120c, except the fourth metal layer 120d.

However, in some example embodiments, if the fixing member 130 is fixed to all the plurality of metal layers 120, there is no metal layer disposed to be spaced apart from the fixing member 130. As such, the fixing member 130 may be fixed to all the plurality of metal layers 120. In this case, the fixing member 130 provides a wider grounding area with respect to the printed circuit board 100 as compared with a case where a printed circuit board is grounded through a through-hole and a fixing bolt penetrating the through-hole. For example, the fixing member 130 may be in contact with all the plurality of metal layers 120 within the printed circuit board 100. The through-hole and the fixing bolt penetrating the through-hole are grounded only in a limited area through a via in the printed circuit board. If the fixing member 130 is fixed to all the plurality of metal layers 120, all the plurality of metal layers 120 may be electrically connected to the fixing member 130, and, thus, a grounding area may be increased. As such, if the fixing member 130 is fixed to all the plurality of metal layers 120, an area to be grounded may be increased within the printed circuit board 100.

A connection unit 125 may electrically connect the metal layers 120a, 120b, and 120c spaced away from the fixing member 130 to the fixing member 130 within the printed circuit board 100. For example, as illustrated in FIG. 4, the connection unit 125 may be configured to electrically connect the fourth metal layer 120d and the third metal layer 120c to each other. Thus, the metal layers 120a, 120b, and 120c, which are not in direct contact with the fixing member 130, may also be grounded through the connection unit 125.

In the printed circuit board 100 according to an example embodiment disclosure, the fixing member 130 is fixed to at least one of the plurality of metal layers 120 and disposed to penetrate only one of the insulation layers 110a and 110e disposed at the outermost periphery from among the plurality of insulation layers 110 and protrude externally. For example, the fixing member 130 may be fixed to the fourth metal layer 120d, which is the outermost metal layer from among the plurality of metal layers 120, with the conductive material. Further, the fixing member 130 may penetrate only the fifth insulation layer 110e from among the first insulation layer 110a and the fifth insulation layer 110e as the outermost insulation layers and protrude to the outside. Therefore, the fixing member 130 and the bolt engaged with the fixing member 130 are not disposed to penetrate the printed circuit board 100. However, the fixing member 130 is disposed to penetrate only one insulation layer 110e of the outermost insulation layers 110a and 110e of the printed circuit board 100. That is, the printed circuit board 100 does not include a separate through-hole for disposing the fixing member 130 and the bolt engaged with the fixing member 130.

Therefore, within the printed circuit board 100 including the plurality of metal layers 120, lines may be further disposed in an area where the fixing member 130 and a hole formed in the fifth insulation layer 110e for disposing the fixing member 130 overlap. In a related art printed circuit board, a through-hole (e.g., the through-hole 49 of FIG. 1) penetrating all of a plurality of insulation layers and a plurality of metal layers of the printed circuit board is formed in the printed circuit board to fix the printed circuit board to a back light unit. Therefore, in the related art printed circuit board, lines cannot be disposed on a through-hole area of a metal layer. That is, if the fixing member 130 is fixed to the fourth metal layer 120d as the outermost metal layer without a through-hole in the printed circuit board 100, the spatial efficiency in disposing lines is improved as compared to a case in which the printed circuit board 100 includes a through-hole.

In the printed circuit board 100 according to an example embodiment of the disclosure, a through-hole penetrating into the printed circuit board 100 is not used. Thus, lines may be further provided in an area, where a through-hole is provided in a related art device. Therefore, in the printed circuit board 100 according to an example embodiment of the present disclosure, lines can be designed more freely to be disposed within the printed circuit board 100. Thus, the spatial efficiency in disposing lines and the straightness of the lines can be improved.

Further, because the number of lines in a space for disposing the metal layers 120 and in the metal layers 120 is further increased, lines can be disposed within the printed circuit board 100 using fewer metal layers 120 in the printed circuit board 100. Thus, the number of metal layers included in the printed circuit board 100 can be reduced, and the printed circuit board 100 can be slimmer.

Figure 5:
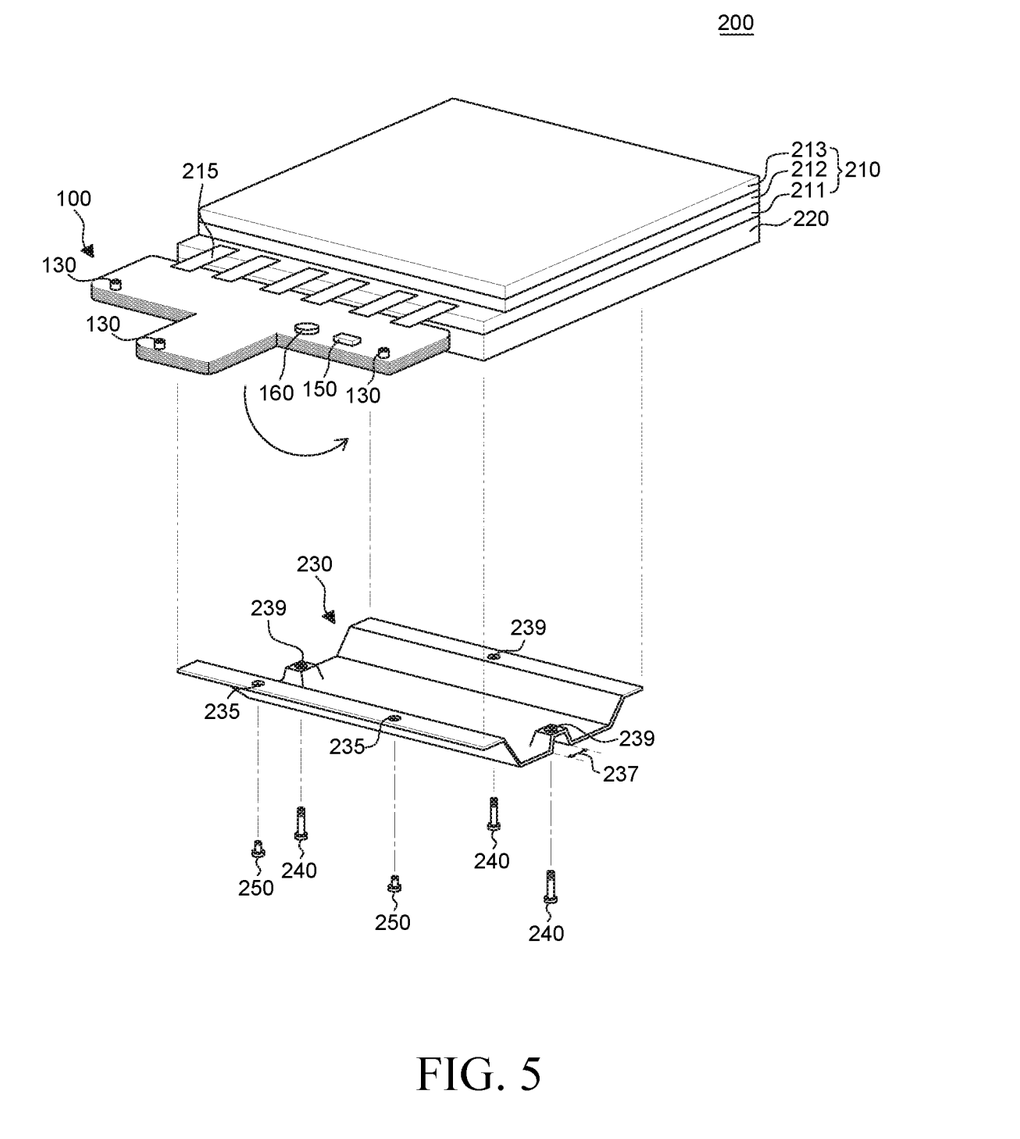
FIG. 5 is a perspective view illustrating a display device according to an example embodiment of the present disclosure.
Figure 6:
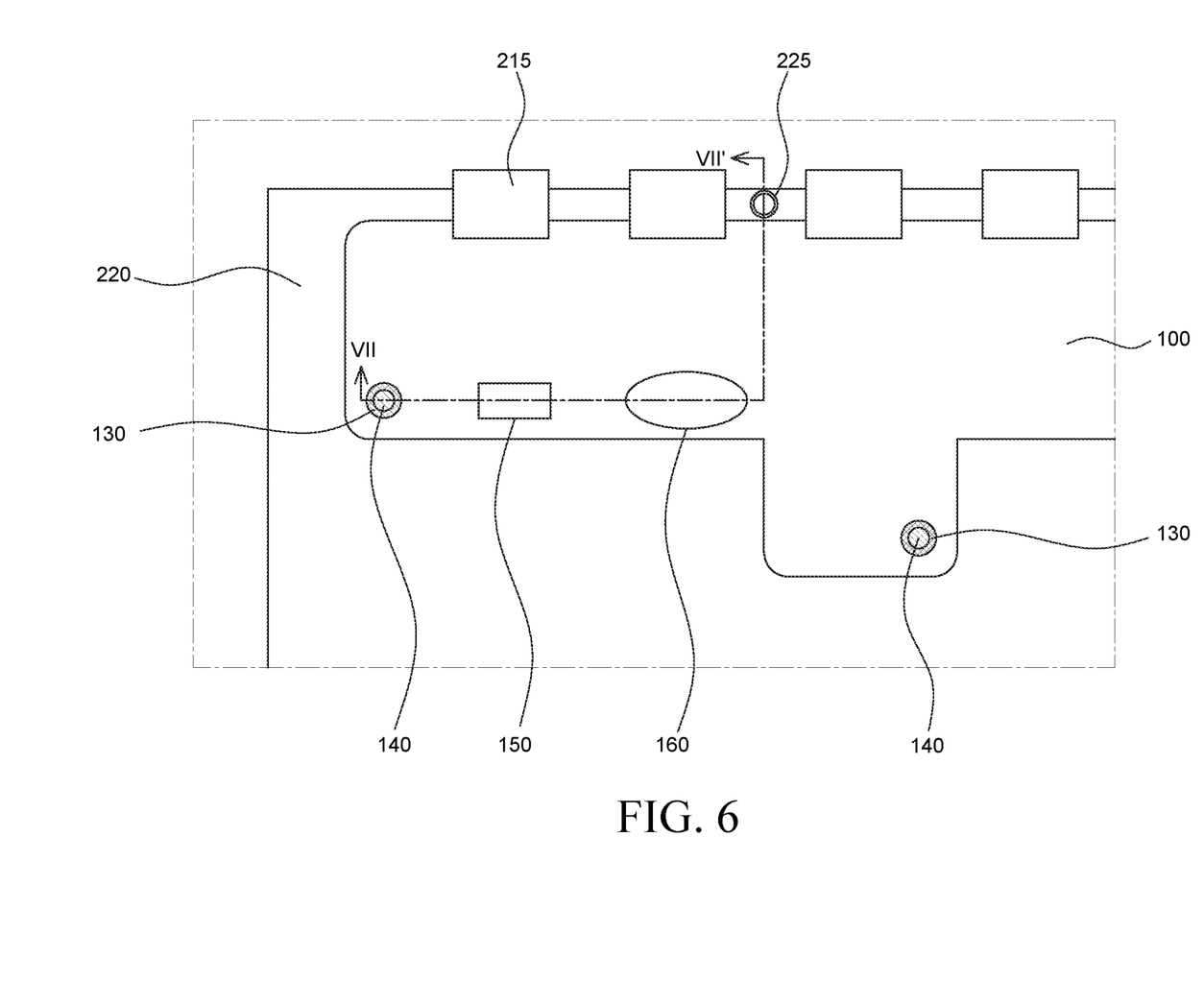
FIG. 6 is a rear view illustrating a display device according to an example embodiment of the present disclosure.
Figure 7:
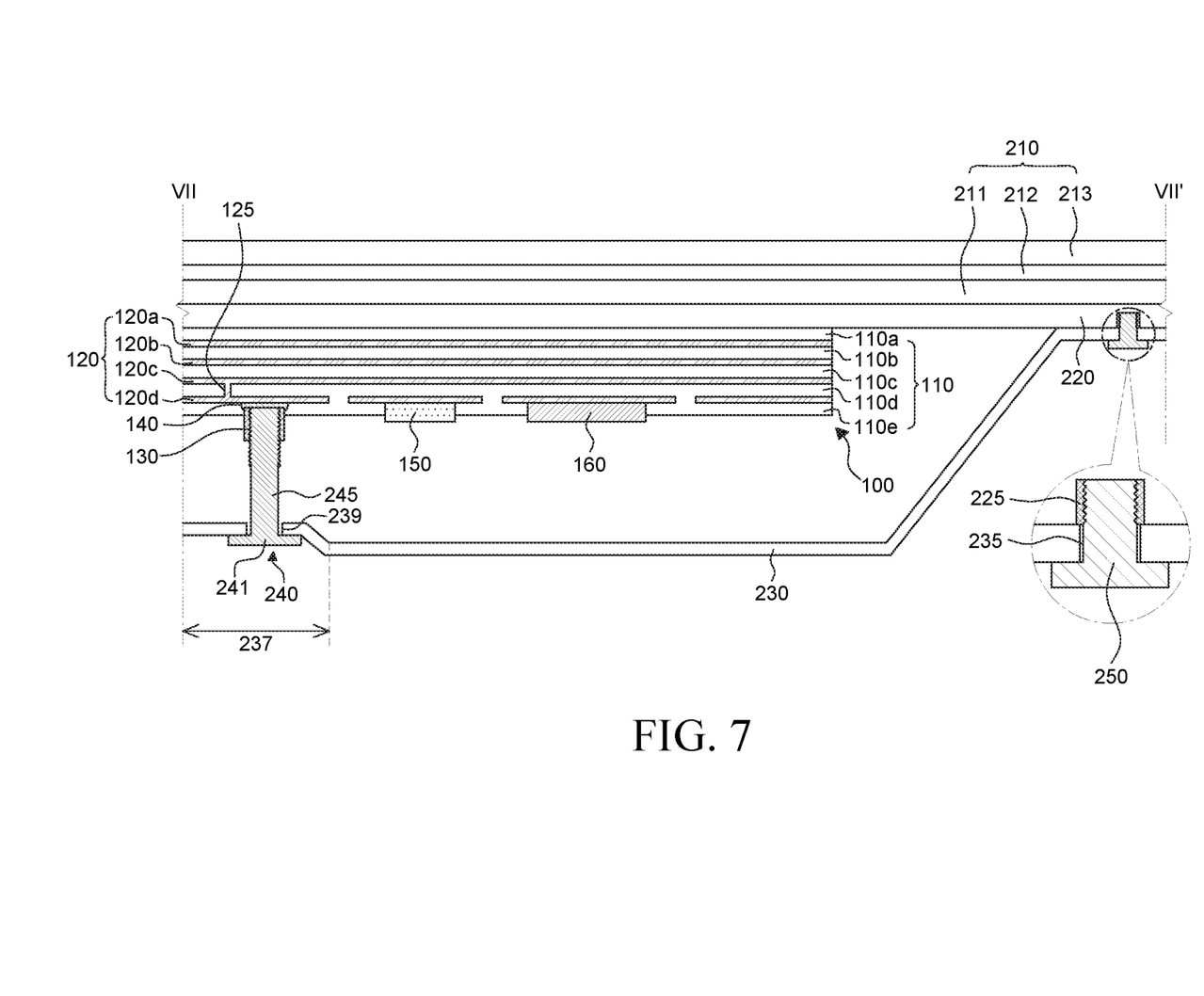
FIG. 7 is a cross-sectional view of a display device taken along line VII-VII' of FIG. 6.

FIG. 5 is a perspective view illustrating a display device according to an example embodiment of the present disclosure. FIG. 6 is a rear view illustrating a display device according to an example embodiment of the present disclosure. FIG. 7 is a cross-sectional view of a display device taken along line VII-VII' of FIG. 6.

With reference to FIGS. 5 to 7, a display device 200 includes a display panel 210, a first device unit 220, a second device unit 230, the printed circuit board 100, a flexible film 215, an engagement member 250, and a second fixing member 240. The following description will be provided using a liquid crystal display panel as an example display panel 210. However, other types of display panels may be used, such as an OLED display panel, but the configuration is not limited to such examples. The printed circuit board 100 illustrated in FIGS. 5 to 7 is substantially similar to the printed circuit board 100 illustrated in FIGS. 3 and 4. Thus, redundant descriptions thereof will be omitted. FIG. 5 illustrates an exploded perspective view of a state before the printed circuit board 100 is combined with the display panel 210, the first device unit 220, and the second device unit 230 for convenience in explanation. Further, for convenience in explanation, FIG. 6 illustrates a case where the flexible film 214 is bent such that the printed circuit board 100 is in contact with a bottom surface of the first device unit 220, and illustration of the second device unit 230 is omitted.

With reference to FIGS. 5 to 7, the display panel 210 includes a TFT substrate 211, a liquid crystal layer 212, and a color filter substrate 213. The TFT substrate 211 includes a thin film transistor (TFT). The TFT controls a plurality of pixels including pixel electrodes and ON/OFF of a driving voltage transferred to each of the plurality of pixels. The liquid crystal layer 212 is disposed between the TFT substrate 211 and the color filter substrate 213. The liquid crystal layer 212 may be any liquid crystal layer known in the art. In the color filter substrate 213, a color filter for realizing a color and a common electrode are disposed. However, the common electrode may be disposed in the TFT substrate 211 rather than in the color filter substrate 213. Further, a polarizing plate may be further provided on the color filter substrate 213 and under the TFT substrate 211, respectively.

As shown in FIG. 5, the printed circuit board 100 is disposed to be adjacent to one side of a substrate 211. For example, the printed circuit board 100 may be disposed on one side of the substrate 211 such that a surface illustrated as a rear surface in FIGS. 3 and 4 faces down. The first device unit 220 may be under the display panel 210. Herein, the first device unit 220 supports a lower part of the display panel 210 and may include a component required for an operation of the display panel 210. For example, if the display panel 210 is a liquid crystal display panel 210, the first device unit 220 may include a back light unit (BLU).

The first device unit 220 includes a conductive material. Therefore, the first device unit 220 may be electrically connected to the printed circuit board 100 to connect the printed circuit board 100 to ground. Details of a function of the first device unit 220 and a combination relationship between the display panel 210, and the printed circuit board 100 will be described later.

The flexible film 215 includes a film-shaped plastic substrate 211 with a chip and lines embedded in the plastic substrate 211. The flexible film 215 may electrically connect the printed circuit board 100 and the substrate 211. That is, the flexible film 215 may transfer various signals between the printed circuit board 100 and the substrate 211.

The flexible film 215 is disposed on one side of the printed circuit board 100. For example, the flexible film 215 may be bonded to one side of the printed circuit board 100 facing one side of the substrate 211. Further, the flexible film 215 is also bonded to one side of the substrate 211 and electrically connects the printed circuit board 100 with the substrate 211.

Further, the plastic substrate of the flexible film 215 is flexible and, thus, bendable. That is, the flexible film 215 is bent in a direction indicated by an arrow in FIG. 5. Therefore, the flexible film 215 may be bent at a lateral part of the printed circuit board 100, the display panel 210, and the first device unit 220. Thus, a bottom surface of the printed circuit board 100 can be brought into contact with the bottom surface of the first device unit 220. That is, the first insulation layer 110a may be in contact with the bottom surface of the first device unit 220 when the flexible film 215 is bent.

The second device unit 230 is disposed under the first device unit 220. The second device unit 230 is disposed such that the printed circuit board 100 is in contact with the bottom surface of the first device unit 220, and then, combined with the printed circuit board 100 and the first device unit 220. That is, the second device unit 230 under the printed circuit board 100 functions to support the printed circuit board 100 to be in contact with the first device unit 220. Further, one side of the second device unit 230 is combined with the first device unit 220.

The second device unit 230 may include a through-hole 239 configured to allow a longitudinal part 245 of the second fixing member 240 to pass through and catch a head part 241 of the second fixing member 240. For example, as illustrated in FIG. 5, the second device unit 230 may include through-holes 239 at positions corresponding to the three first fixing members 130 disposed in the printed circuit board 100. The printed circuit board 100 is rotated to be in contact with a lower part of the first device unit 220.

Meanwhile, the second device unit 230 may be configured such that a periphery of the through-hole 239 is concavely recessed toward the first device unit 220 (i.e., toward the inside of the second device unit). For example, as illustrated in FIG. 7, the longitudinal part 245 of the second fixing member 240 passes through the through-hole 239 and the head part 241 of the second fixing member 240 is caught by the periphery of the through-hole 239. In this case, a recess part 237 in which the periphery of the through-hole 239 of the second device unit 230 is concavely recessed to the inside may be included so that the head part 241 of the second fixing member 240 not to protrude lower than the second device unit 230.

The printed circuit board 100 is between the first device unit 220 and the second device unit 230. The printed circuit board 100 includes the plurality of insulation layers 110, the one or more metal layers 120 between the plurality of insulation layers 110, and the first fixing member 130, which contacts the outermost metal layer 120a closest to the second device unit 230 among the one or more metal layers 120 and penetrates only the outermost insulation layer 110a adjacent to the second device unit 230 among the insulation layers to protrude to the outside. For example, as illustrated in FIG. 7, the first fixing member 130 is in contact with the fourth metal layer 120d and penetrates the fifth insulation layer 110e, thereby protruding externally.

Further, the printed circuit board 100 includes the conductive material 140 disposed between a metal layer 120d and the first fixing member 130, thereby electrically connecting the first fixing member 130 with the metal layer 120d to fix the first fixing member 130 to the metal layer fixed to the first fixing member 130, as described above.

The driving unit 150 supplies various signals and provides power to elements or parts electrically connected to the printed circuit board 100. For example, the driving unit 150 may supply control signals for controlling elements of the liquid crystal display panel 210 or driving signals for driving the elements of the liquid crystal display panel 210. For example, the driving unit 150 may include a drive integrated circuit (IC) configured to drive the TFT disposed on the lower substrate 211 of the liquid crystal display panel 210 and a timing controller configured to control driving timing of the drive IC.

Further, in some example embodiments, the communication unit 160 may transmit and receive a signal to communicate with an external device. For example, if the printed circuit board 100 is included in a communication device such as a smart phone or the like, the communication unit 160 may transmit and receive various signals to communicate with an external device.

The second fixing member 240 penetrates the second device unit 230 and supports the printed circuit board 100, which is combined with the first fixing member 130. That is, the second fixing member 240 passes through the through-hole 239 formed in the second device unit 230 to be inserted into the first fixing member 130, thereby supporting the printed circuit board 100.

Meanwhile, the first fixing member 130 may be a nut. Further, the second fixing member 240 may be a bolt including a screw thread to be inserted into and fixed to the nut. The second fixing member 240 includes the head part 241 and the longitudinal part 245 extended from the head part 241 in a longitudinal direction. That is, the second fixing member 240 includes the head part 241 having a wide cross-sectional area and the longitudinal part 245 extended from the head part 241 in the longitudinal direction. At an end of the longitudinal part 245, the screw thread is formed to be inserted into the first fixing member 130 to be fixed with the first fixing member 130.

With reference to FIGS. 5 and 6, the printed circuit board 100 covers a part of the first device unit 220. Further, the second device unit 230 is disposed to cover one surface of the printed circuit board 100 and one surface of the first device unit 220. That is, the printed circuit board 100 is disposed on the bottom surface of the first device unit 200 to be spaced apart from an end of the first device unit 220 to cover a part of the first device unit 220. Further, the second device unit 230 may cover the printed circuit board 100 and may also cover a part of the first device unit 220. For example, as shown in FIG. 5, a first part of the second device unit 230 may cover a part of the first device unit 220, and a second part of the second device unit 230 may cover the printed circuit board 100.

Herein, the first device unit 220 is formed flat in an area where the first device unit 220 and the printed circuit board 100 overlap. That is, the first device unit 220 has a flat surface without including a groove or a hole in the area where the first device unit 220 and the printed circuit board 100 overlap. In an area where the first device unit 220 and the printed circuit board 100 do not overlap, the first device unit 220 may include a combination groove to be combined with other devices.

The first device unit 220 is engaged with the second device unit 230 in an area covered by and directly contacting the second device unit 230. Further, the first device unit 220 includes an engagement groove 225 (as an example third fixing member) to be engaged with the second device unit 230. Specifically, as illustrated in FIGS. 6 and 7, the first device unit 220 includes the engagement groove 225 in a part that is not overlapped with the printed circuit board 100 and not covered by the flexible film 215. The engagement groove 225 is combined with the engagement member 250 (as an example fourth fixing member) inserted through an engagement hole 235 of the second device unit 230. The engagement hole 235 will be described later.

The second device unit 230 includes the engagement hole 235 to be engaged with the first device unit 220. Further, the first device unit 220 and the second device unit 230 are electrically connected to each other through the engagement member 250 penetrating the engagement hole 235 and combined with the engagement groove 225. For example, as illustrated in FIG. 7, the first device unit 220 and the second device unit 230 include the engagement groove 225 and the engagement hole 235, respectively. The engagement groove 225 and the engagement hole 235 are formed at positions corresponding to each other. The engagement member 250 penetrates the engagement hole 235 and is combined with the engagement groove 225. The engagement member 250 electrically connects the first device unit 220 and the second device unit 230. Therefore, the metal layers of the printed circuit board 100 may be grounded by the first device unit 220 and the second device unit 230.

Further, the second device unit 230 includes a slanted portion so that an area for the engagement hole 235 of the second device unit 230 can be close to the first device unit 220. Here, the printed circuit board 100 is not provided between the second device unit 230 and the first device unit 220 in the area for the engagement hole 235. For example, as illustrated in FIGS. 5 and 7, the area for the engagement hole 235 of the second device unit 230 can abut the first device unit 220 by having the slanted portion. However, unlike illustrated in the drawing, the second device unit 230 may omit the slanted portion. In this case, the length of the engagement member 250 may be increased accordingly.

As described above, the metal layers 120 of the printed circuit board 100 are electrically connected by the first fixing member 130. Further, the first fixing member 130 and the second fixing member 240 are formed of conductive materials. Furthermore, the second device unit 230 is formed of a metal material to connect the metal layers 120 of the printed circuit board 100 with ground. That is, the metal layers 120 of the printed circuit board 100 are electrically connected with the first fixing member 130 through conductive materials, and the first fixing member 130 is electrically connected with the second fixing member 240. Further, the second fixing member 240 is electrically connected with the second device unit 230. Therefore, the metal layers 120 of the printed circuit board 100 may be grounded by the second device unit 230.

As shown in FIG. 7, when the first fixing member 130 and the second fixing member 240 are combined, the second device unit 230 and the printed circuit board 100 may be spaced apart from each other. As described above, circuit elements, such as the driving unit 150 and/or the communication unit 160, are mounted on the fifth insulation layer 110e of the printed circuit board 100. Here, the printed circuit board 100 and the second device unit 230 may be spaced away from each other at a certain distance corresponding to a space for the circuit elements, such as the driving unit 150 and/or the communication unit 160, on the fifth insulation layer 110e. The distance can be obtained because the longitudinal part 245 of the second fixing member 240 with a sufficient length is fixed to the first fixing member 130 and the second device unit 230. Here, the distance may be, for example, about 4 mm.

As described above, at least one of the metal layers 120 of the printed circuit board 100 may be spaced away from the first fixing member 130. For example, as illustrated in FIG. 7, the fourth metal layer 120d may be fixed to the first fixing member 130 and the second metal layer 120b, the third metal layer 120c, and the first metal layer 120a are spaced away from the first fixing member 130. As illustrated in the example of FIG. 7, the first to fourth insulating layers 110a-110d do not include a hole through which the first fixing member 130 penetrates. Further, a position where the second metal layer 120b, the third metal layer 120c, and the first metal layer 120a are electrically connected to the fourth metal layer 120d for ground connection can be freely designed. Meanwhile, as for the second metal layer 120b, the third metal layer 120c, and the first metal layer 120a, lines for ground connection may be disposed through another route. Accordingly, as the number of metal layers spaced away from the first fixing member 130 is increased, lines can be freely disposed in the printed circuit board, and the layout efficiency of the lines can be increased. Further, detour routes of lines can be reduced due to the through-hole 239 required to dispose the first fixing member 130. Furthermore, signals passing through lines can be transferred more stably due to the improved straightness of the lines.

The example embodiments of the present disclosure can also be described as follows.

According to example embodiments of the present disclosure, a printed circuit board is provided. The printed circuit board includes a plurality of insulation layers. At least one metal layer is provided between the plurality of insulation layers. A fixing member is fixed to the at least one of metal layer and disposed to pass through an outmost one of the insulation layers to protrude externally. Thus, the layout of lines in the printed circuit board can be freely designed so that the spatial efficiency in the printed circuit board can be increased. At least one of the metal layers except the at least one fixed metal layer may be disposed to be spaced away from the fixing member. The metal layer spaced away from the fixing member may be electrically connected or insulated to the metal layer fixed to the fixing member.

The printed circuit board may further include a conductive material disposed between the fixing member and the metal layer fixed to the fixing member to fix the fixing member to the metal layer and electrically connecting the fixing member and the metal layer. The fixing member may be a nut formed of a metal material.

According to other example embodiments of the present disclosure, a display device is provided. The display device includes a display panel. A first device unit is under the display panel. A second device unit is under the first device unit. A printed circuit board is between the first device unit and the second device unit and includes a plurality of insulation layers, one or more metal layers between the plurality of insulation layers, and a first fixing member fixed to a closest one of the at least one metal layer to the second device unit and passing through an outermost one of the insulation layers to protrude externally. A second fixing member passes through the second device unit and the fixing member is fixed to the first fixing member.

The first fixing member may be a nut and the second fixing member may be a bolt. The bolt may include a head part and a longitudinal part extended from the head part in a longitudinal direction. The second device unit may include a through-hole configured to allow the longitudinal part to pass through and catch the head part. The second device unit may be configured such that a periphery of the through-hole is concavely recessed to the inside.

The printed circuit board may be disposed to cover a part of the first device unit. The second device unit may be disposed to cover the printed circuit board to provide protection thereof. In the first device unit, a surface facing the printed circuit board may be formed flat. The first device unit may be configured to be engaged with the second device unit in an area where the first device unit is in contact with the second device unit.

The first device unit may include an engagement groove to be engaged with the second device unit, and the second device unit may include an engagement hole to be engaged with the first device unit. The first device unit and the second device unit may be electrically connected to each other by an engagement member penetrating the engagement hole and combined with the engagement groove.

The metal layers, the first fixing member, the second fixing member, and the second device unit may be electrically connected to each other, and the second device unit may be formed of a metal material to connect the metal layers to ground. At least one of the metal layers may be disposed to be spaced away from the first fixing member. The printed circuit board may further include a conductive material between the first fixing member and a metal layer fixed to the first fixing member, thereby electrically connecting and also fixing the first fixing member to the metal layer.

According to other example embodiments of the present disclosure, a printed circuit board is provided. The printed circuit board includes a substrate having a structure of metal layers and insulating layers alternately stacked together. The substrate having an upper surface covered by an upper insulating layer. A conductive connector extends in a perpendicular direction from a metal layer directly under the upper surface of the substrate and protrudes through the upper insulating layer. The conductive connector is configured to receive an attaching member. The conductive connector provides a grounding connection between the attaching member and the metal layer directly under the upper surface of the substrate. The conductive connector allows on or more metal layers to pass thereunder.

The printed circuit board includes a plurality of exposure areas where the upper insulating layer does not cover the metal layer, and the conductive connector is disposed on one of the plurality of exposure areas. The one of the plurality of exposure areas is adjacent to an edge of the substrate.

The one or more metal layers passing under the conductive connector are electrically insulated from the conductive connector. The printed circuit board includes a conductive material between the conductive connector and the metal layer under the upper surface of the substrate. The conductive connector is fixed to a shielding member to provide protection thereof. The shielding member is located apart from the printed circuit board and fastened to the printed circuit board via a fastener. The fastener is conductive and configured to electrically connect the shielding member to the conductive connector.

In accordance with the present disclosure, a problem of the above-described configuration in which a printed circuit board includes a through-hole and lines formed by patterning a metal layer are bent several times to avoid the through-hole and a spatial limitation on line layout has been recognized. To solve the above-described problem, the present disclosure provides a printed circuit board having a novel structure capable of increasing the straightness of lines and the layout efficiency of the lines in the printed circuit board and a display device including the same. Herein, a fixing member fixed to at least one of metal layers of the printed circuit board and penetrating only one of insulation layers disposed at an outermost periphery is used, and thus, a through-hole is not formed in at least some of the metal layers. For example, a printed circuit board in which some of metal layers of a printed circuit board are spaced away from the fixing member. Thus, lines in the printed circuit board can be freely disposed and the spatial efficiency of the metal layers can be maximized. Additionally, a display device including the printed circuit board can be provided.

It will be apparent to those skilled in the art that various modifications and variations can be made in the printed circuit board and the display device including the same without departing from the scope of the disclosure. Thus, it is intended that the present disclosure cover numerous modifications and variations provided they come within the scope of the appended claims and/or their equivalents.

What is claimed is:

1. A display device, comprising:
   a display panel;
   a first device unit under the display panel;
   a second device unit under the first device unit;
   a printed circuit board between the first device unit and the second device unit and including a plurality of insulation layers, at least one metal layer between the plurality of insulation layers, a first fixing member fixed to a closest one of the at least one metal layer to the second device unit and passing through an outermost one of the insulation layers to protrude externally, and a conductive material disposed between the first fixing member and the one of the at least one metal layer; and
   a second fixing member passing through the second device unit and fixed to the first fixing member,
   wherein one side of the conductive material directly contacts the first fixing member and other side of the conductive material directly contacts the one of the at least one metal layer to fix and to electrically connect the first fixing member with the one of the at least one metal layer.

2. The display device according to claim 1, wherein the second device unit covers the printed circuit board to provide protection thereof.

3. The display device according to claim 1, wherein the closest one of the at least one metal layer, the first fixing member, the second fixing member, and the second device unit are electrically connected to each other.

4. The display device according to claim 1, wherein at least one of the at least one metal layer overlapping the first fixing member is spaced apart and electrically isolated from the first fixing member.

5. The display device according to claim 1, wherein the first fixing member does not pass through all of the insulation layers.

6. The display device according to claim 1, wherein the printed circuit board includes a plurality of exposure areas where the outermost one of the insulation layers does not cover the closest one of the at least one metal layer to the second device unit, and the first fixing member disposed on one of the plurality of exposure areas.

7. The display device according to claim 6, wherein the one of the plurality of exposure areas is adjacent to an edge of the printed circuit board.

8. A display device comprising:
a display panel;
a printed circuit board (PCB) having components that are operatively connected with the display panel,
the PCB, including metal layers and insulating layers alternately stacked together, having an upper surface covered by an upper insulating layer,
the PCB having a conductive connector in electrical contact with and extending in a perpendicular direction from at least one of the metal layers and protruding outwardly from the upper insulating layer;
an attachment unit, having an attaching member, configured to be connected with the display panel, and
a conductive material disposed between the conductive connector and one of the at least one metal layer;
wherein the conductive connector is configured to receive the attaching member of the attachment unit, to provide an electrical grounding connection and to allow one or more metal layers to pass thereunder, a combination of which achieves more efficient wiring layout designs when compared to a conventional PCB that lacks the conductive connector and
wherein one side of the conductive material directly contacts the conductive connector and other side of the conductive material directly contacts the one of the at least one metal layer to fix and to electrically connect the conductive connector with the one of the at least one metal layer.

9. The display device of claim 8, wherein the conductive connector does not pass through all of the insulating layers of the PCB.

10. The display device of claim 9, wherein the conductive connector foregoes the need for separate through holes being provided in the PCB for attachment with the attachment unit or other elements.

11. The display device of claim 10, wherein the conductive connector is a nut member configured to receive a bolt or screw member being the attaching member of the attachment unit.

12. The display device of claim 11, wherein the display panel is a liquid crystal display (LCD) panel and the attachment unit comprises a backlight unit (BLU) that provides light to the LCD panel.

13. The display device of claim 11, wherein the display panel is an organic light-emitting diode (OLED) display panel and the attachment unit comprises a substrate related to the OLED display panel.

\* \* \* \* \*